(12) United States Patent
Choi et al.

(10) Patent No.: US 9,368,559 B2
(45) Date of Patent: Jun. 14, 2016

(54) ORGANIC LIGHT EMITTING DISPLAY DEVICE HAVING SIGNAL LINES AND ELECTRODE ON THE SAME LAYER AND METHOD OF MANUFACTURING THE SAME

(71) Applicant: SAMSUNG DISPLAY CO., LTD., Yongin, Gyeonggi-do (KR)

(72) Inventors: Jung-Mi Choi, Yongin (KR); Young-In Hwang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/178,006

(22) Filed: Feb. 11, 2014

(65) Prior Publication Data

US 2014/0346470 A1    Nov. 27, 2014

(30) Foreign Application Priority Data

May 23, 2013    (KR) .................. 10-2013-0058550

(51) Int. Cl.
*H01L 27/32*    (2006.01)
*H01L 51/56*    (2006.01)

(52) U.S. Cl.
CPC ........ *H01L 27/3244* (2013.01); *H01L 27/3276* (2013.01); *H01L 51/56* (2013.01); *H01L 27/3248* (2013.01); *H01L 2227/323* (2013.01)

(58) Field of Classification Search
CPC . H01L 27/3244; H01L 51/56; H01L 27/3276; H01L 27/3248; H01L 2227/323
USPC ............................................. 257/40; 438/46
See application file for complete search history.

(56) References Cited

U.S. PATENT DOCUMENTS

| | | | |
|---|---|---|---|
| 2005/0008894 A1* | 1/2005 | Hiruma et al. | 428/690 |
| 2007/0200494 A1* | 8/2007 | Matsudate et al. | 313/506 |
| 2009/0009068 A1* | 1/2009 | Fujimura et al. | 313/504 |
| 2012/0146030 A1 | 6/2012 | You et al. | |
| 2013/0076231 A1* | 3/2013 | Nakanishi et al. | 313/500 |
| 2014/0117314 A1* | 5/2014 | Jeong et al. | 257/40 |

FOREIGN PATENT DOCUMENTS

| | | |
|---|---|---|
| KR | 10-2010-0066221 | 6/2010 |
| KR | 10-2011-0035049 | 4/2011 |
| KR | 10-2012-0066492 | 6/2012 |

\* cited by examiner

*Primary Examiner* — Peter Bradford
(74) *Attorney, Agent, or Firm* — F. Chau & Associates, LLC

(57) ABSTRACT

Provided is an organic light emitting display device. The device includes an organic electroluminescence element in which a pixel electrode, an intermediate layer including a light emitting layer, and a cathode electrode are successively stacked, a cathode contact including an upper electrode contacting the cathode electrode and a lower electrode disposed on the same layer as the pixel electrode to contact the upper electrode, and a line disposed on the same layer as the lower electrode. At least three cathode contacts are disposed in a direction crossing the line, and the line is disposed between the cathode contacts.

20 Claims, 9 Drawing Sheets

ORGANIC LIGHT EMITTING DISPLAY DEVICE HAVING SIGNAL LINES AND ELECTRODE ON THE SAME LAYER AND METHOD OF MANUFACTURING THE SAME

CROSS-REFERENCE TO RELATED PATENT APPLICATION

This application claims priority to Korean Patent Application No. 10-2013-0058550, filed on May 23, 2013, in the Korean Intellectual Property Office, the disclosure of which is incorporated by reference herein in its entirety.

TECHNICAL FIELD

Exemplary embodiments of the present invention relate to displays, and more specifically, to an organic light emitting display device and a method of manufacturing the organic light emitting display device.

DISCUSSION OF THE RELATED ART

In an organic light emitting display, a cathode electrode of an organic light emitting element serves as a common electrode. The same may be applied from an external circuit and received at cathode contacts of the cathode electrodes to be provided to all of pixels of the organic light emitting display. pixel layer A signal line may be insulated from the cathode electrode and its cathode contact by an interlayer dielectric layer. The interlayer dielectric layer may contact the cathode electrode. However, if an external force is applied to the signal line, a short may occur between the cathode electrode and the line.

SUMMARY

According to an exemplary embodiment of the present invention, an organic light emitting display device includes an organic electroluminescence element. In the organic electroluminescence element, a pixel electrode, an intermediate layer including a light emitting layer, and a cathode electrode are successively stacked. At least three cathode contacts each include an upper electrode and a lower electrode. The upper electrode contacts the cathode electrode. The lower electrode is disposed on the same layer as the pixel electrode. The lower electrode contacts the upper electrode. A line is disposed on the same layer as the lower electrode. The cathode contacts are disposed in a direction crossing the line. The line is disposed between two adjacent cathode contacts of the cathode contacts.

The lower electrode may include a first electrode disposed on the same layer as the pixel electrode. A second electrode contacts the first electrode and the upper electrode.

Each of the pixel electrode and the first electrode may include a transparent conductive metallic oxide. Each of the second electrode and the upper electrode may include Ag, Mg, Al, Pt, Pd, Au, Ni, Nd, Ir, Cr, Li, Ca, Mo, Ti, W, MoW, Cu, and/or La.

The organic light emitting display device may further include a thin film transistor. The thin film transistor includes an active layer, a gate electrode, and source and drain electrodes. The gate electrode includes a lower gate electrode disposed on the same layer as the first electrode and an upper gate electrode disposed on the same layer as the second electrode. The source and drain electrodes are disposed on the same layer as the upper electrode. The source and drain electrodes contact the active layer.

The organic light emitting display device may further include a capacitor. The capacitor includes a lower capacitor electrode disposed on the same layer as the active layer and an upper capacitor electrode disposed on the same layer as the first electrode.

The organic light emitting display device may further include an interlayer dielectric layer and a pixel layer. The interlayer dielectric layer is disposed between the lower electrode and the upper electrode. The pixel layer contacts an edge area of the upper electrode. The pixel layer is disposed on the interlayer dielectric layer.

The line may include a first line disposed on the same layer as the pixel electrode and a second line disposed on the first line. The second line contacts the interlayer dielectric layer.

The upper electrode may contact the lower electrode through a contact hole in the interlayer dielectric layer.

The interlayer dielectric layer may include an inorganic insulating material.

The pixel layer may include an organic insulating material.

The cathode contacts may be disposed in a non-display region.

The cathode contacts may be separated from each other by a slit in a direction crossing the line.

The line may include a global signal line.

According to an exemplary embodiment of the present invention, a method of manufacturing an organic light emitting display device includes forming a first electrode pattern, at least three second electrode patterns, and a third electrode pattern. The second electrode patterns respectively include lower electrodes. The third electrode pattern includes a line. The second electrode patterns may be formed in a direction crossing the third electrode pattern. The third electrode pattern may be disposed between two adjacent second electrode patterns of the second electrode patterns. An interlayer dielectric layer is formed. The interlayer dielectric layer has an opening exposing a surface of the first electrode pattern and a contact hole exposing a surface of each of the second electrode patterns. The interlayer dielectric layer covers the line. A pixel electrode is formed from the first electrode pattern. An upper electrode is formed, contacting each of the lower electrodes through the contact hole. A pixel layer is formed, exposing the pixel electrode and a portion of the upper electrode. A cathode electrode is formed on the pixel layer. The cathode electrode contacts the upper electrode.

The lower electrodes may be disposed in a non-display region of the organic light emitting display device.

The lower electrodes may be separated from each other by a slit in a direction crossing the line.

The line may include a global signal line.

The interlayer dielectric layer may include an inorganic insulating material.

The pixel layer may include an organic insulating material.

According to an exemplary embodiment of the present invention, an organic light emitting display device comprises an organic electroluminescence element. The organic electroluminescence element comprises a pixel electrode, a light emitting layer, and a cathode electrode. A plurality of cathode contacts each comprises a first electrode and a second electrode. The first electrode contacts the cathode electrode. The second electrode is disposed on the same layer as the pixel electrode. The second electrode contacts the first electrode. A plurality of signal lines is disposed on the same layer as the second electrode. The plurality of cathode contacts is separated from each other in a direction crossing the line. Each of the plurality of signal lines is disposed between two adjacent cathode contacts of the plurality of cathode contacts.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Hereinafter, exemplary embodiments of the present invention will be described in more detail with reference to the accompanying drawings. The present invention, however, may be modified in various different ways and should not be construed as limited to the embodiments set forth herein.

Figure 1:
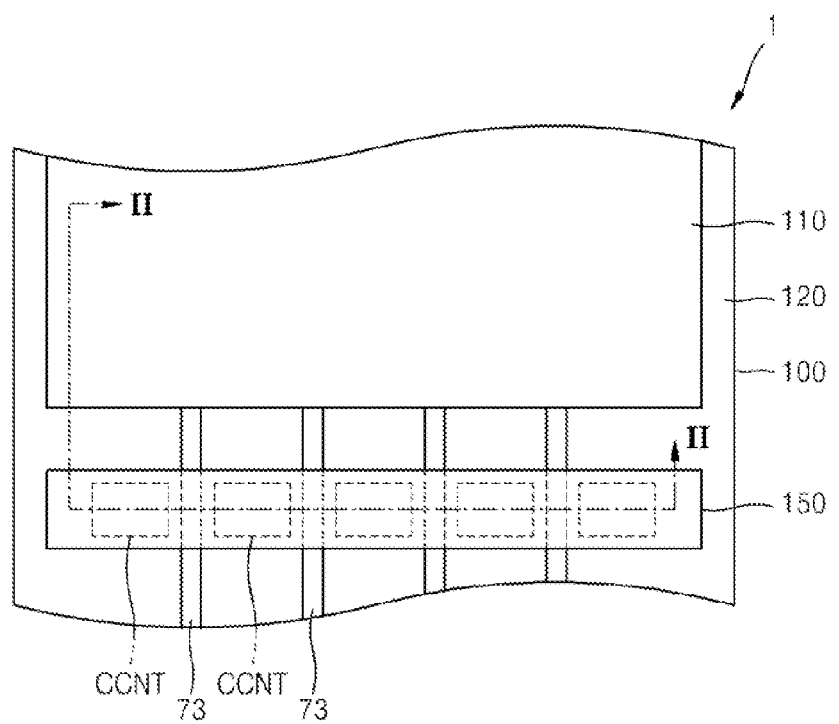
FIG. 1 is a plan view illustrating a structure of an organic light emitting display device according to an exemplary embodiment of the present invention.

FIG. 1 is a schematic plan view illustrating a structure of an organic light emitting display device 1 according to an exemplary embodiment of the present invention.

The organic light emitting display device 1 includes a display region 110 in which a plurality of pixels are arranged on a substrate 100 and a non-display region 120 defined in a peripheral region of the display region 110.

The substrate 100 may include a low temperature polysilicon (LTPS, crystalline silicon) substrate, a glass substrate, or a plastic substrate.

Pixels that are basic units for displaying an image are arranged in a matrix form in the display region 110. Lines electrically connected to the pixels, respectively, are disposed in the display region 110. Each pixel may include a pixel circuit including at least one thin film transistor TFT and capacitor CST and an organic electroluminescence element EL. The organic electroluminescence element EL has a pixel electrode connected to a thin film transistor TFT, an emissive layer (EML), and a cathode electrode that are sequentially stacked. The cathode electrode may function as a common electrode for the pixels. A cathode voltage is supplied into each of the pixels through the cathode electrode. The non-display region 120 may include a cathode bus region 150 in which cathode contacts CCNT are electrically connected to the cathode electrode of the display region 110. In the cathode bus region 150, a cathode voltage is supplied from an external circuit through a cathode contact CCNT to each of the pixels. At least one cathode bus region 150 may be defined in at least one side of the non-display region 120. At least one cathode contact CCNT may be disposed in the cathode bus region 150.

In an exemplary embodiment of the present invention, each cathode contact CCNT is disposed in the non-display region 120 and electrically connects a cathode bus line to a cathode electrode in an external portion of the display region 110, thus facilitating the electrical contact between the cathode electrode and the cathode bus line.

A line 73 may pass through the cathode bus region 150, and the line 73 may be connected to the display region 110. A current or voltage may be transmitted to the thin film transistor TFT or the organic electroluminescence element EL disposed in the display region 110 through the line 73. The line 73 may be a global signal line. The global signal line may be formed of the same material as a gate of the thin film transistor TFT, and the global signal line may initialize all of the pixels substantially simultaneously, compensate for a threshold voltage, and control light emission in a simultaneous emission pixel structure (simultaneous emission with active voltage (SEAV), ASEAV, and source spontaneous emission (SSE)).

The substrate 100 may be adhered to an encapsulation substrate facing the substrate 100 by a sealing member disposed in the non-display region 120. A getter disposed in the non-display region 120 may block moisture from the outside.

Figure 2:
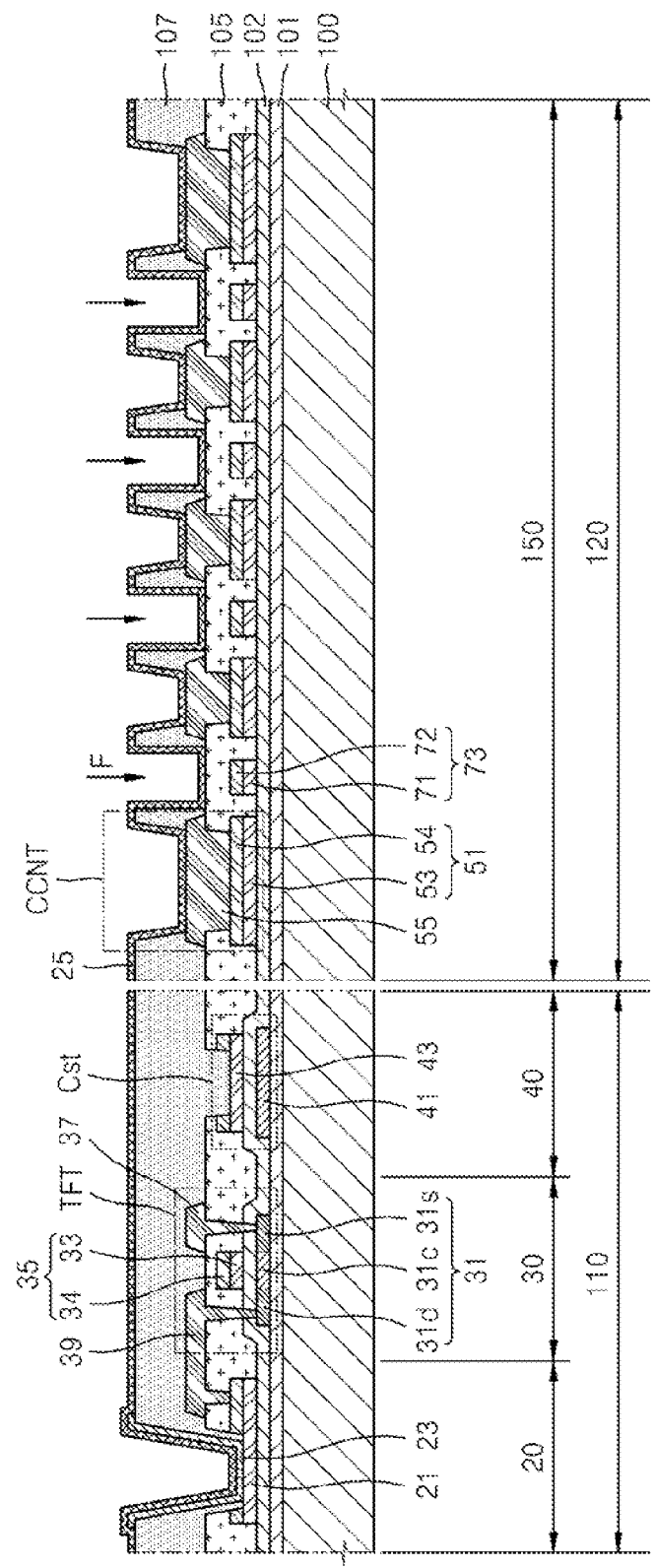
FIG. 2 is a cross-sectional view taken along line II-II of FIG. 1, according to an exemplary embodiment of the present invention.

FIG. 2 is a cross-sectional view taken along line II-II of FIG. 1, according to an exemplary embodiment of the present invention.

Referring to FIG. 2, the organic light emitting display device 1 includes a light emitting region 20, a transistor region 30, and a storage region 40 in the display region 110 and the cathode bus region 150 in the non-display region 120.

The organic electroluminescence element EL is disposed in the light emitting region 20. The organic electroluminescence element EL includes a pixel electrode 21 electrically connected to one of source/drain electrodes 37 and 39 of the thin film transistor TFT, a cathode electrode 25 facing the pixel electrode 21, and an intermediate layer 23 disposed between pixel electrode 21 and the cathode electrode 25. The pixel electrode 21 may be formed of a transparent conductive metallic oxide. The pixel electrode 21 may be formed of the same material as a lower gate electrode 33 of the thin film transistor TFT on the same layer as the lower gate electrode 33.

The thin film transistor TFT is disposed in the transistor region 30 as a driving device. The thin film transistor TFT includes an active layer 31, a gate electrode 35, and the source/drain electrodes 37 and 39. The gate electrode 35 includes the lower gate electrode 33 and an upper gate electrode 34 disposed on the lower gate electrode 33. The lower gate electrode 33 may be formed of a transparent conductive metallic oxide. A first insulating layer 102 that is a gate insulating layer is disposed between the gate electrode 35 and the active layer 31, and the first insulating layer 102 insulates the gate electrode 35 from the active layer 31. Source/drain regions $31s$ and $31d$ doped with high-density impurities are defined in two opposite edges, respectively, of the active layer 31. The source/drain regions $31s$ and $31d$ are connected to the source/drain electrodes 37 and 39, respectively. A channel region $31c$ is disposed between the source/drain regions $31s$ and $31d$.

The capacitor Cst is disposed in the storage region 40. The capacitor Cst includes a lower capacitor electrode 41 and an upper capacitor electrode 43. The first insulating layer 102 is disposed between the lower capacitor electrode 41 and the upper capacitor electrode 43. The lower capacitor electrode 41 may be disposed on the same layer as the active layer 31 of the thin film transistor TFT. The lower capacitor electrode 41 may be formed of a semiconductor material, and the lower capacitor electrode 41 may be doped with impurities to increase electrical conductivity. The upper capacitor electrode 43 may be disposed on the same layer as the lower gate electrode 33 of the thin film transistor TFT and the pixel electrode 21 of the organic electroluminescence element EL.

The cathode contact CCNT, which electrically connects the lower electrode 51 to the cathode electrode 25, is disposed in the cathode bus region 150. The upper electrode 55 may directly contact the cathode electrode 25, and thus, the upper electrode 55 may be electrically connected to the cathode electrode 25. A second electrode 54 directly contacts the first electrode 53, but does not directly contact the cathode electrode 25. The second electrode 54 is disposed on the first electrode 53. The upper electrode 55 directly contacts the cathode electrode 25, but does not directly contact the first electrode 53. The upper electrode 55 is disposed on the second electrode 54. The first electrode 53 may be disposed on the same layer as the lower gate electrode 33 of the thin film transistor TFT, the pixel electrode 21 of the organic electroluminescence element EL, and the upper capacitor electrode 43 of the capacitor Cst. The second electrode 54 may be disposed on the same layer as the upper gate electrode 34 of the thin film transistor TFT. The upper electrode 55 may be disposed on the same layer as the source/drain electrodes 37 and 39 of the thin film transistor TFT.

The line 73 insulated from the cathode contact CCNT is disposed in the cathode bus region 150. The line 73 may be disposed between the cathode contacts CONT. The line 73 may include a first line 71 disposed on the same layer as the pixel electrode 21 or the first electrode 53 and a second line 72 disposed on the first line 71. The second line 72 contacts the second insulating layer 105.

At least three cathode contacts CCNT may be disposed in a direction crossing the line 73. The line 73 may be disposed between two adjacent cathode contacts of the cathode contacts CCNT. The cathode contacts CCNT may be separated from each other by a slit in a direction crossing the line 73. Each line 73 may be disposed between two adjacent cathode contacts CCNT. Accordingly, a local force F that may cause a short circuit between the cathode electrode 25 and the line 73 may be dispersed. Thus, the short circuit between the cathode electrode 25 and the line 73 may be prevented, thus increasing product reliability.

FIGS. 3 to 9 are views illustrating a process of manufacturing an organic light emitting display device 1 illustrated in FIG. 2, according to an exemplary embodiment of the present invention.

Figure 3:
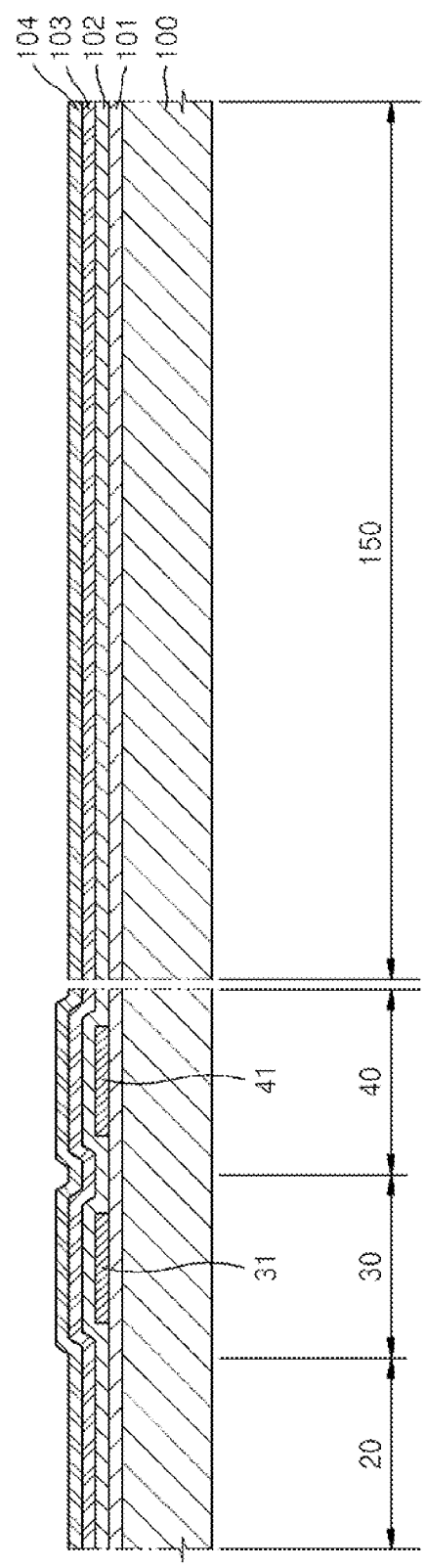
FIGS. 3 to 9 are cross-sectional views illustrating a process of manufacturing an organic light emitting display device illustrated in FIG. 2, according to an exemplary embodiment of the present invention.

As shown in FIG. 3, an auxiliary layer 101 may be formed on a substrate 100. The substrate 100 may be formed of transparent glass using $SiO_2$ as a main component. However, exemplary embodiments of the present invention are not limited thereto. For example, the substrate 100 may be formed of various materials such as a transparent plastic or metal.

The auxiliary layer 101, such as a barrier layer, a blocking layer, and/or a buffer layer, may be provided on the substrate 100. The auxiliary layer 101 may prevent diffusion of impurity ions and permeation of moisture and external air, and the auxiliary layer 101 may planarize a surface of the substrate 100. The auxiliary layer 101 may be formed of $SiO_2$ and/or $SiN_x$ by various depositing methods, such as a plasma enhanced chemical vapor deposition (PECVD) method, an atmospheric pressure CVD (APCVD) method, and a low pressure CVD (LPCVD) method.

An active layer 31 of a thin film transistor TFT and a lower capacitor electrode 41 are formed on the auxiliary layer 101. Polycrystalline silicon may be patterned, forming the active layer 31 and the lower capacitor electrode 41. Each of the active layer 31 and the lower capacitor electrode 41 may include a semiconductor and doped impurity ions. Each of the active layer 31 and the lower capacitor electrode 41 may be formed of an oxide semiconductor. Although the active layer 31 is separately formed from the lower capacitor electrode 41 as shown in FIG. 3, the active layer 31 may be integrated with the lower capacitor electrode 41.

A first insulating layer 102, a first conductive layer 103, and a second conductive layer 104 may be successively formed on an entire surface of the substrate 100 on which the active layer 31 and the lower capacitor electrode 41 have been formed.

The first insulating layer 102 may be obtained by depositing an inorganic insulating layer including, e.g., $SiN_x$ or $SiO_x$, by a PECVD method, an APCVD method, or an LPCVD method. The first insulating layer 102 may be disposed between the active layer 31 and the gate electrode 35 of the thin film transistor TFT, and the first insulating layer 102 may function as a gate insulating layer of the thin film transistor TFT. The first insulating layer 102 may be disposed between the upper capacitor electrode 43 and the lower capacitor electrode 41, and the first insulating layer 102 may function as a dielectric layer.

The first conductive layer 103 may include one or more transparent materials such as ITO, IZO, ZnO, and/or $In_2O_3$. The first conductive layer 103 may be patterned later, forming the pixel electrode 21, the lower gate electrode 33, the upper capacitor electrode 43, and the first electrode 53 of the lower electrode 51.

The second conductive layer 104 may include Ag, Mg, Al, Pt, Pd, Au, Ni, Nd, Ir, Cr, Li, Ca, Mo, Ti, W, MoW, Cu, and/or La. The second conductive layer 104 may have a three-layered structure, such as Mo—Al—Mo or Mo—AlNiLa—Mo. The second conductive layer 104 may be patterned later, forming the upper gate electrode 34, and the second electrode 54 of the lower electrode 51.

However, exemplary embodiments of the present invention are not limited thereto. For example, the first conductive layer 103 may include a material having a higher corrosion resistance than a corrosion resistance of the second conductive layer 104, and the second conductive layer 104 may include a material having a lower electrical resistance than an electrical resistance of the first conductive layer 103.

Figure 4:
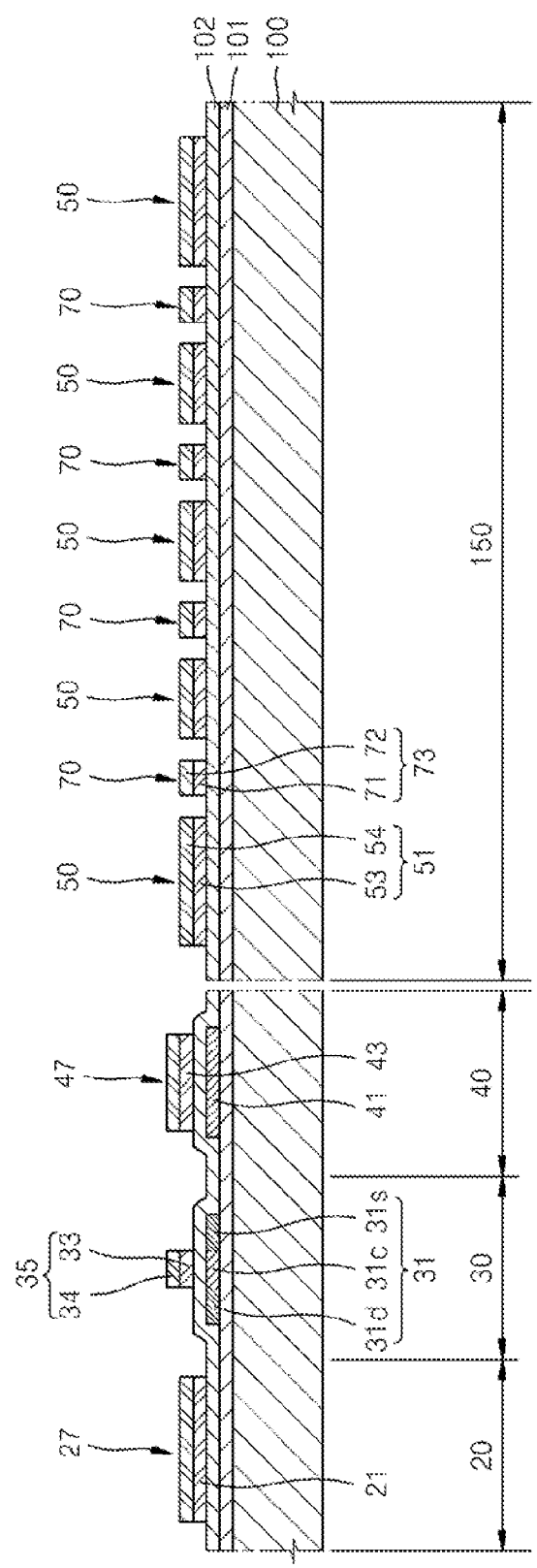

As shown in FIG. 4, the first conductive layer 103 and the second conductive layer 104 may be patterned, forming the gate electrode 35, a first electrode pattern 27, a second electrode pattern 50, a third electrode pattern 70, and a forth electrode pattern 47 on the substrate 100.

The gate electrode 35 may be formed on the active layer 31 in the transistor region 30, and the gate electrode 35 includes the lower gate electrode 33 formed as a portion of the first conductive layer 103 and the upper gate electrode 34 formed as a portion of the second conductive layer 104.

The gate electrode 35 may correspond to a center of the active layer 31. N-type or p-type impurities may be doped into the active layer 31 by using the gate electrode 35 as a self align mask, and thus, source/drain regions 21$s$ and 21$d$ may be formed at two opposite edges, respectively, of the active layer 31 that correspond to two opposite sides of the gate electrode 35. A channel region 21$c$ is formed between the source/drain regions 21$s$ and 21$d$. The impurities may include boron (B) ions or phosphorus (P) ions.

The first electrode pattern 27 for later forming a pixel electrode may be formed in the light emitting region 20, and a fourth electrode pattern 47 for later forming the upper capacitor electrode 43 may be formed on the lower capacitor electrode 41 in the storage region 40. At least three second electrode patterns 50 for later forming the first electrode 53 and the second electrode 54 may be formed in the cathode bus region 150. A third electrode pattern 70 for forming a line 73 including a first line 71 and a second line 72 may be formed between the second electrode patterns 50.

The line 73 formed by the third electrode pattern 70 may be a global signal line. The global signal line may initialize all of the pixels substantially at the same time, compensate for a threshold voltage, and control light emission in a simultaneous emission pixel structure (SEAV, ASEAV, and SSE).

At least three second electrode patterns 50 for forming the lower electrode 51 may be formed in a direction crossing the third electrode pattern 70 for forming the line 73. The third electrode pattern 70 may be disposed between the second electrode patterns 50. The second electrode patterns 50 may be separated from each other by a slit in a direction crossing the second electrode pattern 50, and each third electrode pattern 70 may be disposed between two adjacent second electrode patterns 50. Accordingly, at least three cathode contacts CCNT (e.g., as shown in FIG. 2) may be formed in a direction crossing the line 73. The line 73 may be disposed between two adjacent cathode contacts CCNT (e.g., as shown in FIG. 2). The cathode contacts CCNT (e.g., as shown in FIG. 2) may be separated from each other by a slit in the direction crossing the line 73, and each line 73 may be disposed between two adjacent cathode contacts CCNT (e.g., as shown in FIG. 2). Accordingly, a local force F (e.g., as shown in FIG. 2) that may cause a short circuit between the cathode electrode 25 and the line 73 may be dispersed. Thus, the short circuit between the cathode electrode 25 (see FIG. 2) and the line 73 may be prevented, increasing product reliability.

Figure 5:
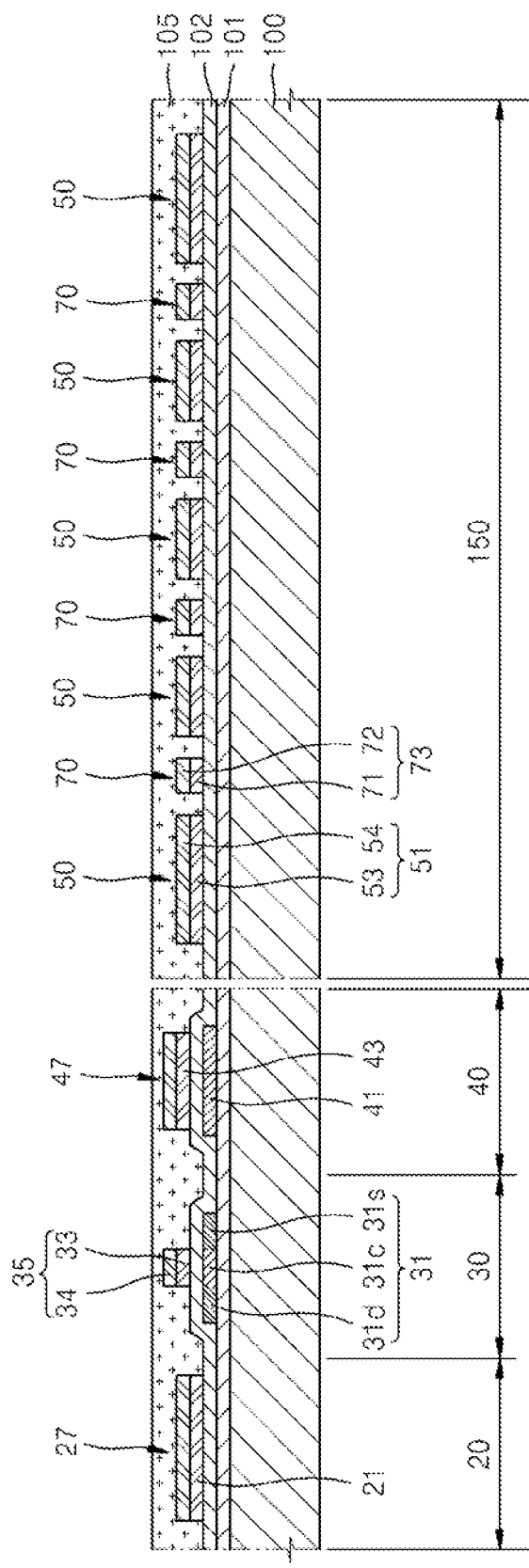

As shown in FIG. 5, a second insulating layer 105 is deposited on the entire surface of the substrate 100 on which the gate electrode 35 has been formed.

The second insulating layer 105 may be formed of an inorganic insulating material that is the same as the first insulating layer 102. The second insulating layer 105 may function as an interlayer dielectric layer between the gate electrode 35 and the source/drain electrodes 37 and 39 of the thin film transistor TFT. The second insulating layer 105 may insulate the lines 73 from each other. The second insulating layer 105 may be formed of an inorganic insulating material and/or at least one organic insulating material including polyimide, polyamide, acryl resin, benzocyclobutane, and/or phenol resin. An organic insulating material layer and an inorganic insulating material layer may be alternately formed in a repeating pattern.

Figure 6:
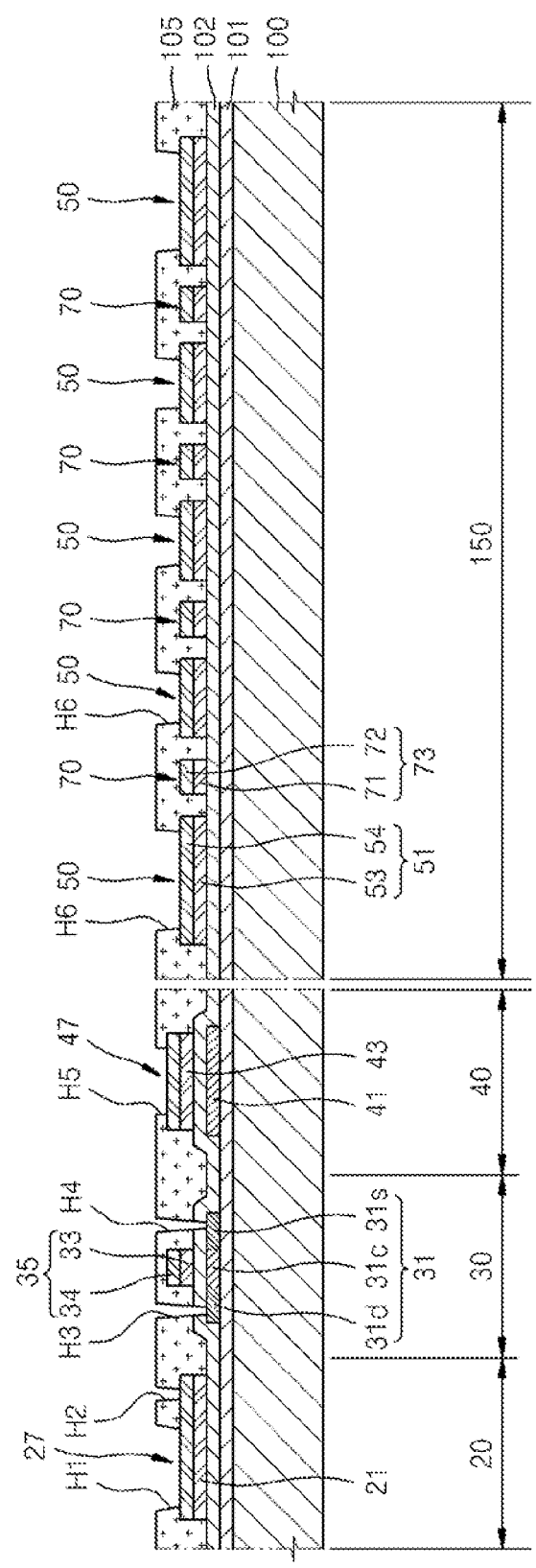

As shown in FIG. 6, the second insulating layer 105 may be patterned, forming openings H1 and H2 exposing the first electrode pattern 27, an opening H5 exposing the fourth electrode pattern 47, contact holes H3 and H4 exposing portions of the source/drain regions 31s and 31d of the active layer 31, and a plurality of contact holes H6 exposing a top surface of the second electrode pattern 50.

The first opening H1 and the second opening H2 may expose at least one portion of the second conductive layer 104 constituting an upper portion of the first electrode pattern 27. The contact holes H3 and H4 may expose the portions of the source/drain regions 31s and 31d, respectively. The fifth opening H5 may expose at least one portion of the second conductive layer 104 constituting an upper portion of the fourth electrode pattern 47. The contact holes H6 may expose at least one portion of the second conductive layer 104 constituting an upper portion of the fifth electrode pattern 50.

Figure 7:
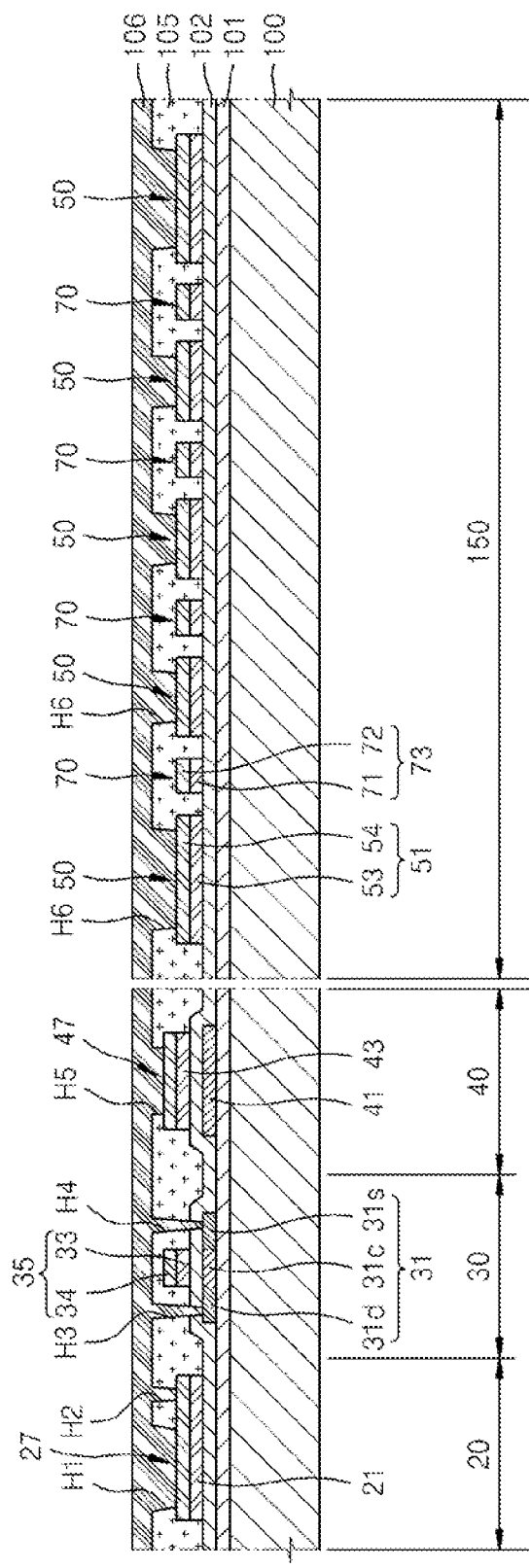

As shown in FIG. 7, the third conductive layer 106 may be deposited on the entire surface of the substrate 100, covering the second insulating layer 105. The third conductive layer 106 may be formed of a material the same conductive material as the first conductive layer 103 or the second conductive layer 104, but exemplary embodiments of the present invention are not limited thereto. For example, the third conductive layer 106 may be formed of at least one conductive material. The third conductive layer 106 may have a thickness sufficient to fill the above-mentioned contact holes H3, H4, and H6, and openings H1, H2, and H5.

Figure 8:
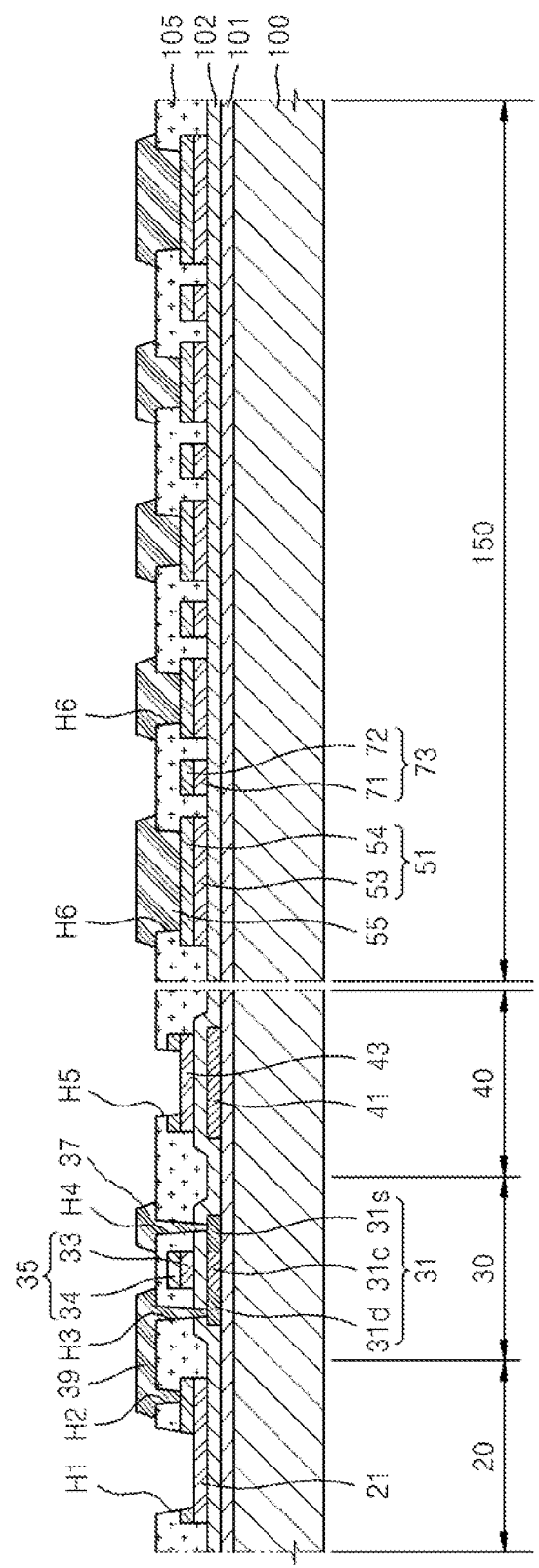

As shown in FIG. 8, the third conductive layer 106 may be patterned, forming the source/drain electrodes 37 and 39 and the upper electrode 55.

The source/drain electrodes 37 and 39 may be electrically connected to the active layer 31 in the source/drain regions 31s and 31d through the contact holes H3 and H4. One of the source/drain electrodes 37 and 39 according to an exemplary embodiment of the present invention, e.g., reference numeral 39 is the drain electrode and may be electrically connected to the pixel electrode 21 through the second opening H2 on an edge area of the second conductive layer 104 formed on the upper portion of the pixel electrode 21.

The upper electrode 55 may directly contact the second electrode 54 of the lower electrode 51 through the contact holes H6.

The source/drain electrodes 37 and 39 are formed, and simultaneously, the pixel electrode 21 and the upper capacitor electrode 43 may be formed. However, exemplary embodiments of the present invention are not limited thereto. For example, the source/drain electrodes 37 and 39 may be formed, and then an additional etching process may be performed to form the pixel electrode 21 and the upper capacitor electrode 43. The second conductive layer 104 exposed through the first opening H1 in the first electrode pattern may be removed, forming the pixel electrode 21. The second conductive layer 104 exposed through the fifth opening H5 in the second electrode pattern may be removed, forming the upper capacitor electrode 43.

Accordingly, the pixel electrode 21, the lower gate electrode 33, the upper capacitor electrode 43, and the first electrode 53 of the lower electrode 51 may be formed of the same material on the same layer. The upper gate electrode 34 and the second electrode 54 of the lower electrode 51 may be formed of the same material on the same layer.

According to an exemplary embodiment of the present invention, n-type or p-type impurities may be injected and doped into the lower capacitor electrode 41 through the opening exposing the upper portion of the upper capacitor electrode 43. The impurities injected and doped into the lower capacitor electrode 41 may be the same as or different from the impurities injected and doped into the active layer 31.

Figure 9:
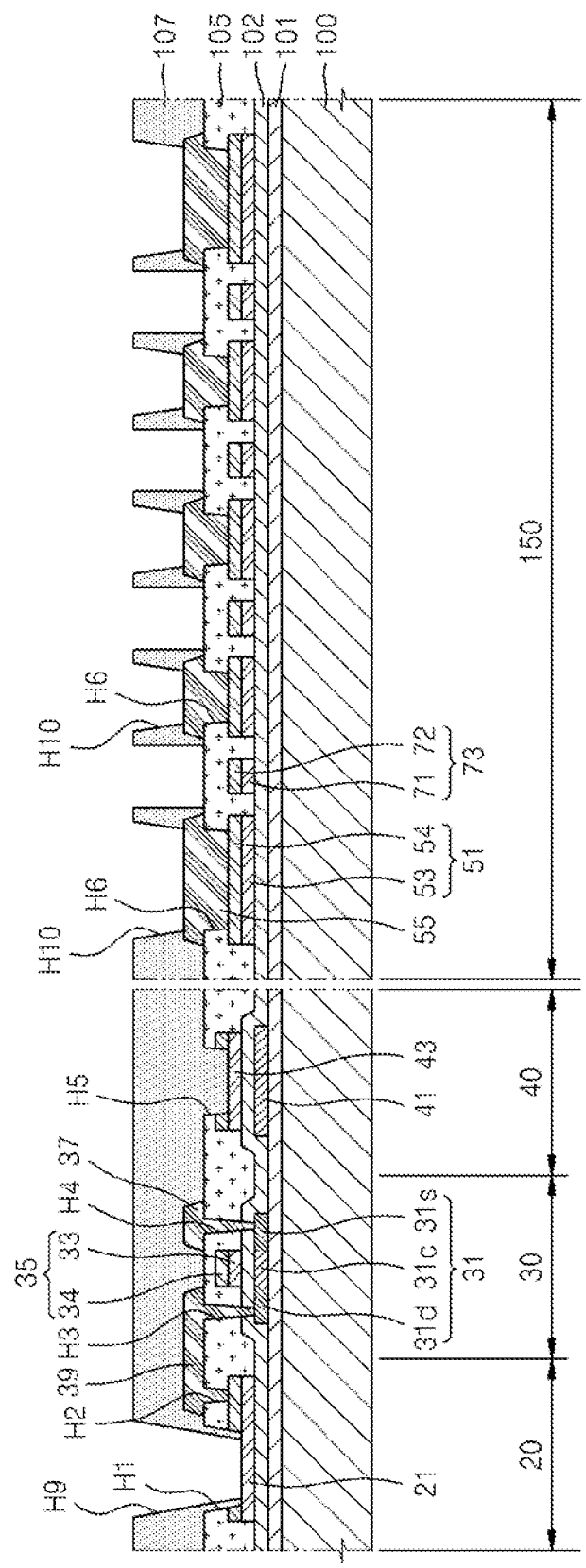

As shown in FIG. 9, a third insulating layer 107 may be formed on the substrate 100.

The third insulating layer 107 may be deposited on an entire surface of the substrate 100 on which the pixel electrode 21, the source/drain electrodes 37 and 39, the upper capacitor electrode 43, the lower electrode 51, and the line 73 have been formed. The third insulating layer 107 may be formed of at least one organic insulating material including polyimide, polyamide, acryl resin, benzocyclobutane, and/or phenol resin by a spin-coating method. The third insulating layer 107 may include an inorganic insulating material, such as $SiO_2$, $SiN_x$, $Al_2O_3$, $CuO_x$, $Tb_4O_7$, $Y_2O_3$, $Nb_2O_5$, and/or $Pr_2O_3$. The third insulation layer 107 may have a multi-layered structure in which an inorganic insulating material layer and an organic insulation material layer are alternately formed in a repeating pattern. The third insulating layer 107 may be patterned, forming a ninth opening H9 exposing a portion of the pixel electrode 21 and a tenth opening H10 exposing a portion of the upper electrode 55. The third insulation layer 107 may function as a pixel layer defining the pixel. The third insulating layer 107 may contact edge areas of the pixel electrode 21 and the upper electrode 55.

Referring back to FIG. 2, an intermediate layer 23 including an emissive layer (EML) and the cathode electrode 25 may be disposed on the ninth opening H9 exposing the pixel electrode 21.

The intermediate layer 23 may have a single-layered structure or a multi-layered structure in which the EML and at least one functional layer of a hole transport layer (HTL), a hole injection layer (HIL), an electron transport layer (ETL), and an electron injection layer (EIL) are stacked one over another. The EML may be formed of a relatively low or high molecular organic material. When the EML emits red, green, and blue light, the EML may be patterned into a red light emitting layer, a green light emitting layer, and a blue light emitting layer. When the organic light emitting layer emits white light, the EML may have a multi-layered structure that has a red light emitting layer, a green light emitting layer, and a blue light emitting layer stacked one over another and that emits white light, or the EML may have a single layered (monolayer) structure including a red light emitting material, a green light emitting material, and a blue light emitting material.

The cathode electrode 25 may be deposited on an entire surface of the substrate 100, forming a common electrode. The cathode electrode 25 may directly contact the upper electrode 55 through the contact hole H10 in the cathode contact CCNT.

When the organic light emitting display device 1 is a bottom emission-type organic light emitting display device that displays an image towards the substrate 100, the pixel electrode 21 may be a transparent electrode, and the cathode electrode 25 may be a reflective electrode. The reflective electrode may be formed by depositing, on the substrate 100, a thin metal layer including a metal having a low work function, for example, one of Ag, Mg, Al, Pt, Pd, Au, Ni, Nd, Ir, Cr, Li, Ca, LiF/Ca or LiF/Al, and/or a combination thereof.

According to an exemplary embodiment of the present invention, a short circuit may be prevented from occurring between the cathode electrode 25 and the line 73.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
an organic electroluminescence element in which a pixel electrode, an intermediate layer comprising a light emitting layer, and a cathode electrode are successively stacked;
at least three cathode contacts, each of the at least three cathode contacts comprising an upper electrode contacting the cathode electrode and a lower electrode disposed on the same layer as the pixel electrode, the lower electrode contacting the upper electrode; and
a line disposed on the same layer as the lower electrode,
wherein the at least three cathode contacts are disposed in a direction crossing the line, and wherein the line is disposed between two adjacent cathode contacts of the at least three cathode contacts.

2. An organic light emitting display device, comprising:
an organic electroluminescence element comprising a pixel electrode, a light emitting layer, and a cathode electrode;
a plurality of cathode contacts, each of the plurality of cathode contacts comprising a first electrode contacting the cathode electrode and a second electrode disposed on the same layer as the pixel electrode, the second electrode contacting the first electrode; and
a plurality of signal lines disposed on the same layer as the second electrode, wherein the plurality of cathode contacts are separated from each other in a direction crossing the plurality of signal lines, and wherein the plurality of lines is disposed between two adjacent cathode contacts of the plurality of cathode contacts.

3. The organic light emitting display device of claim 2, wherein the second electrode comprises a third electrode disposed on the same layer as the pixel electrode and a fourth electrode contacting the third electrode and the first electrode.

4. The organic light emitting display device of claim 3, wherein each of the pixel electrode and the third electrode comprises a transparent conductive metallic oxide, and
wherein each of the fourth electrode and the first electrode comprises Ag, Mg, Al, Pt, Pd, Au, Ni, Nd, Ir, Cr, Li, Ca, Mo, Ti, W, MoW, Cu, or La.

5. The organic light emitting display device of claim 3, further comprising a thin film transistor comprising an active layer, a gate electrode, and source and drain electrodes, the gate electrode comprising a lower gate electrode disposed on the same layer as the third electrode and an upper gate electrode disposed on the same layer as the fourth electrode, and the source and drain electrodes disposed on the same layer as the upper electrode,
wherein the source and drain electrodes contact the active layer.

6. The organic light emitting display device of claim 5, further comprising a capacitor comprising a lower capacitor electrode disposed on the same layer as the active layer and an upper capacitor electrode disposed on the same layer as the third electrode.

7. The organic light emitting display device of claim 2, further comprising:
an interlayer dielectric layer disposed between the second electrode and the first electrode; and
a pixel layer contacting an edge area of the first electrode, the pixel layer disposed on the interlayer dielectric layer.

8. The organic light emitting display device of claim 7, wherein the plurality of lines comprises a first line disposed on the same layer as the pixel electrode and a second line disposed on the first line, the second line contacting the interlayer dielectric layer.

9. The organic light emitting display device of claim 7, wherein the first electrode contacts the second electrode through a contact hole in the interlayer dielectric layer.

10. The organic light emitting display device of claim 7, wherein the interlayer dielectric layer comprises an inorganic insulating material.

11. The organic light emitting display device of claim 7, wherein the pixel layer comprises an organic insulating material.

12. The organic light emitting display device of claim 2, wherein at least three cathode contacts of the plurality of cathode contacts are disposed in a non-display region of the organic light emitting display device.

13. The organic light emitting display device of claim 2, wherein the at least three cathode contacts are separated from each other by a slit.

14. The organic light emitting display device of claim 2, wherein the plurality of lines includes a global signal line.

15. A method of manufacturing an organic light emitting display device, the method comprising:
forming a first electrode pattern, a plurality of second electrode patterns respectively including lower electrodes, and a third electrode pattern including a line, wherein the at least three second electrode patterns are formed in a direction crossing the third electrode pattern, and the third electrode pattern is disposed between two adjacent second electrode patterns of the plurality of second electrode patterns;

forming an interlayer dielectric layer having an opening exposing a surface of the first electrode pattern and a contact hole exposing a surface of each of the plurality of second electrode patterns, the interlayer dielectric layer covering the line;

forming a pixel electrode from the first electrode pattern and forming an upper electrode contacting each of the lower electrodes through the contact hole;

forming a pixel layer exposing the pixel electrode and a portion of the upper electrode; and forming a cathode electrode contacting the upper electrode, the cathode electrode formed on the pixel layer.

16. The method of claim 15, wherein the lower electrodes of at least three second electrode patterns of the plurality of second electrode patterns are disposed in a non-display region of the organic light emitting display device.

17. The method of claim 15, wherein the lower electrodes are separated from each other by a slit.

18. The method of claim 15, wherein the line includes a global signal line.

19. The method of claim 15, wherein the interlayer dielectric layer comprises an inorganic insulating material.

20. The method of claim 15, wherein the pixel layer comprises an organic insulating material.

* * * * *